United States Patent [19]

Umezawa et al.

[11] Patent Number: 5,023,695
[45] Date of Patent: Jun. 11, 1991

[54] FLAT COOLING STRUCTURE OF INTEGRATED CIRCUIT

[75] Inventors: Kazuhiko Umezawa; Toshiaki Komatsu, both of Tokyo; Jun Kubokawa, Yamanashi, all of Japan

[73] Assignee: NEC Corporation, Tokyo, Japan

[21] Appl. No.: 349,411

[22] Filed: May 8, 1989

[30] Foreign Application Priority Data

| May 9, 1988 | [JP] | Japan | 63-113222 |
| Jun. 22, 1988 | [JP] | Japan | 63-155523 |
| Oct. 6, 1988 | [JP] | Japan | 63-253539 |
| Oct. 6, 1988 | [JP] | Japan | 63-253540 |
| Mar. 10, 1989 | [JP] | Japan | 1-58720 |

[51] Int. Cl.$^5$ .................................. H01L 25/04
[52] U.S. Cl. ........................... 357/82; 357/81; 361/382; 361/385
[58] Field of Search ............... 357/82, 81, 80; 361/381, 382, 385, 386, 387, 389; 165/80.4

[56] References Cited

U.S. PATENT DOCUMENTS

| 2,357,706 | 6/1942 | Toepperwein | 156/80 |
| 2,783,418 | 2/1957 | Peter et al. | 317/234 |
| 2,999,034 | 9/1961 | Heidenhain | 117/5.5 |
| 3,205,469 | 9/1965 | Frank et al. | 339/18 |
| 3,211,969 | 10/1965 | Colaiaco | 317/234 |
| 3,299,946 | 1/1967 | Reckinghausen | 165/80 |
| 3,651,865 | 3/1972 | Feldmanis | 165/80 |
| 3,777,220 | 12/1973 | Tatusko et al. | 174/685 |
| 3,827,457 | 8/1974 | Vutz et al. | 137/599 |
| 3,881,181 | 4/1975 | Khajezadeh | 357/69 |
| 3,908,188 | 9/1975 | Kawamoto | 357/82 |
| 3,912,001 | 10/1975 | Missman et al. | 165/80 |
| 3,993,123 | 11/1976 | Chu et al. | 165/80 |
| 4,037,270 | 7/1977 | Ahmann et al. | 361/385 |
| 4,093,971 | 6/1978 | Chu et al. | 361/382 |

(List continued on next page.)

FOREIGN PATENT DOCUMENTS

| 2583921 | 12/1986 | France | 357/82 |
| 55-86130 | 6/1980 | Japan | |
| 56-70655 | 6/1981 | Japan | |
| 57-106062 | 7/1982 | Japan | |
| 0130450 | 7/1984 | Japan | 357/82 |
| 59-130450 | 7/1984 | Japan | |
| 60-160150 | 8/1985 | Japan | |
| 0257156 | 12/1985 | Japan | 357/81 |
| 60-257156 | 12/1985 | Japan | |
| 61-171157 | 8/1986 | Japan | |
| 61-226946 | 10/1986 | Japan | |
| 0226946 | 10/1986 | Japan | 357/82 |
| 0276242 | 12/1986 | Japan | 357/28 |
| 61-276242 | 12/1986 | Japan | |
| 63-81959 | 4/1988 | Japan | |
| 63-226049 | 9/1988 | Japan | |
| 0226049 | 9/1988 | Japan | 357/82 |
| 63-308943 | 12/1988 | Japan | |
| 572951 | 9/1977 | U.S.S.R. | |

OTHER PUBLICATIONS

Microelectronics, Scientific American, published 1977 by W. H. Freeman and Company, San Francisco, Cover page, pp. 51, 166.
Assembly Techniques, pp. 404-420, understood to be from the book Integrated Circuit Engineering, publishing date not known.
IEEE Transactions On Components, Hybrids and Manufacturing Technol., vol. CHMT-2, No. 3, Sep. 1979, (List continued on next page.)

Primary Examiner—Rolf Hille
Assistant Examiner—Hoanganh Le
Attorney, Agent, or Firm—Burns, Doane, Swecker & Mathis

[57] ABSTRACT

A circuit assembly with circulation of coolant. A plurality of chips of integrated circuit are arranged on a substrate separately from each other in rows and columns. A circulating unit disposed on the substrate and having a planar shape circulates coolant therethrough. The circulating unit has within its bottom side a plurality of cells arranged in rows and columns correspondingly to the plurality of chips. Each individual cell is thermally connected to the corresponding individual chip so as to receive therefrom heat generated thereby. The circulating unit includes a distributor for distributing to the respective cells the circulated coolant effective to absorb the heat received in the respective cells.

6 Claims, 6 Drawing Sheets

U.S. PATENT DOCUMENTS

| | | | |
|---|---|---|---|
| 4,109,707 | 8/1978 | Wilson et al. | 165/46 |
| 4,110,549 | 8/1978 | Goetzke et al. | 174/16 HS |
| 4,115,836 | 9/1978 | Hutchison et al. | 361/382 |
| 4,158,875 | 6/1979 | Tajima et al. | 361/384 |
| 4,196,775 | 4/1980 | Groh | 165/68 |
| 4,204,246 | 5/1980 | Arii et al. | 165/105 |
| 4,226,281 | 10/1980 | Chu | 165/80 |
| 4,245,273 | 1/1981 | Feinberg et al. | 361/382 |
| 4,282,924 | 8/1981 | Faretra | 165/80 E |
| 4,381,032 | 4/1983 | Cutchaw | 165/46 |
| 4,398,208 | 8/1983 | Murano et al. | 357/81 |
| 4,439,918 | 4/1984 | Carroll et al. | 29/840 |
| 4,467,522 | 8/1984 | Marchisi | 29/827 |
| 4,468,717 | 8/1984 | Mathias et al. | 361/382 |
| 4,493,010 | 1/1985 | Morrison et al. | 361/385 |
| 4,498,122 | 2/1985 | Rainal | 361/414 |
| 4,509,096 | 4/1985 | Baldwin et al. | 361/386 |
| 4,535,385 | 8/1985 | August et al. | 361/388 |
| 4,536,824 | 8/1985 | Barrett et al. | 361/384 |
| 4,546,410 | 10/1985 | Kaufman | 361/387 |
| 4,574,879 | 3/1986 | DeGree et al. | 165/185 |
| 4,588,023 | 5/1986 | Munekawa | 165/104.33 |
| 4,602,125 | 7/1986 | West et al. | 174/138 G |
| 4,602,678 | 7/1986 | Fick | 165/79 |
| 4,628,990 | 12/1986 | Hagihara et al. | 165/80 |
| 4,641,176 | 2/1987 | Keryhuel et al. | 357/74 |
| 4,644,385 | 2/1987 | Nakanishi et al. | 357/82 |
| 4,666,545 | 5/1987 | DeGree et al. | 156/252 |
| 4,680,673 | 7/1987 | Tauerdet | 357/82 |
| 4,685,211 | 8/1987 | Hagihara et al. | 29/382 |
| 4,686,606 | 8/1987 | Yamada et al. | 361/385 |
| 4,689,659 | 8/1987 | Watanabe | 357/82 |
| 4,712,158 | 12/1987 | Kikuchi et al. | 361/385 |
| 4,721,996 | 1/1988 | Tustaniwskyj et al. | 357/82 |
| 4,724,611 | 2/1988 | Hagihara | 29/840 |
| 4,727,554 | 2/1988 | Watanabe | 372/36 |
| 4,729,424 | 3/1988 | Mizuno et al. | 165/30 |
| 4,744,007 | 5/1988 | Watari et al. | 361/386 |
| 4,748,495 | 5/1988 | Kucharek | 357/82 |
| 4,750,086 | 6/1988 | Mittal | 361/382 |
| 4,768,352 | 9/1988 | Maruyama | 62/383 |
| 4,781,244 | 11/1988 | Kuramitsu et al. | 165/80.4 |
| 4,783,721 | 11/1988 | Yamamoto et al. | 361/382 |
| 4,791,983 | 12/1988 | Nicol et al. | 165/80.4 |
| 4,794,981 | 1/1989 | Mizuno | 165/80.4 |
| 4,809,134 | 2/1989 | Tustaniwskyj et al. | 361/385 |
| 4,884,167 | 11/1989 | Mine et al. | 361/382 |
| 4,942,497 | 7/1990 | Mine et al. | 361/385 |
| 4,945,980 | 8/1990 | Umezawa | 165/101 |
| 4,975,766 | 12/1990 | Umezawa | 357/81 |

OTHER PUBLICATIONS

"Bumped Tape Automated Bonding (BTAB) Practical Application Guidelines", Kanz et al., pp. 301–308.

IEEE Transactions on Components, Hybrids, and Manufacturing Tech., vol. CHMT-3, No. 1, Mar. 1980, "IBM Multichip Multilayer Ceramic Modules for LSI Chips—Design for Performance and Density", Clark et al., pp. 89–93.

IBM J. Res. Develop., vol. 26, No. 1, pp. 55–66 (Jan. 1982), "A Conduction-Cooled Module for High-Performance LSI Devices", Oktay et al.

Electronics, "Supercomputers Demand Innovation In Packaging and Cooling", Lyman, pp. 136–144, Sep. 22, 1982.

IBM Technical Disclosure Bulletin, "Counter-Flow Cooling System", Chu, vol. 8, No. 11, Apr. 1966, p. 1692.

IBM Technical Disclosure Bulletin, vol. 18, No. 12, pp. 3982–3983, "Heat-Pipe Cooled Stacked Electronic Wafer Package", Kerjilian et al., May 1976.

IBM Technical Disclosure Bulletin, vol. 20, No. 4, Sep. 1977, "Method of Effective Cooling of a High Power Silicon Chip", Doo et al., pp. 1436–1437.

IBM Technical Disclosure Bulletin, vol. 20, No. 11A, Apr. 1978, "Three-Dimensional MLC Substrate Integrated Circuit Support Package", Aichelmann et al., pp. 4349 and 4350.

IBM Technical Disclosure Bulletin, vol. 20, No. 11A, Apr. 1978, "Conduction-Cooling Module", Hwang et al., pp. 4334–4335.

IBM Technical Disclosure Bulletin, vol. 21, No. 6, (Nov. 1978), "Compliant Cold Plate Cooling Scheme", Antonetti et al., p. 2433.

IBM Technical Disclosure Bulletin, vol. 21, No. 6, Nov. 1978, "Solid Encapsulated Module", Chu et al., pp. 2435–2436.

Forward and Introduction of IEEE International Conference On Computer Design: VLSI In Computers; ICCD '83 Session: The New IBM 4381, 3 pages (Nov. 1, 1983).

IEEE International Conference On Computer Design: VLSI In Computer ICCD '83 Session: The New IBM 4381, "New Internal and External Cooling Enhancements For the Air-Cooled IBM 4381 Module", Oktay et al., 4 pages (Nov. 1, 1983).

IEEE International Conference On Computer Design: VLSI In Computer ICCD '83 Session: The New IBM 4381, "Electrical Design and Analysis of the Air-Cooled Module (ACM) in IBM System/4381", Cherensky et al., 6 pages (Nov. 1, 1983).

IEEE International Conference On Computer Design: VLSI In Computer ICCD '83 Session: The New IBM 4381, "Hermetic Tin/Lead Solder Sealing For the Air-Cooled IBM 4381 Module", Brady et al., 4 pages (Nov. 1, 1983).

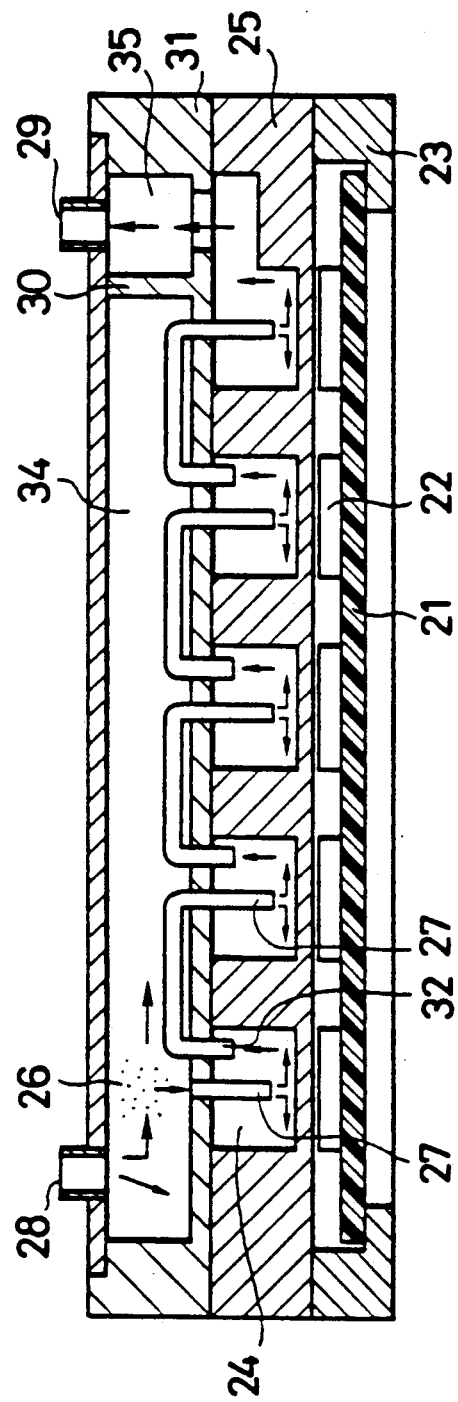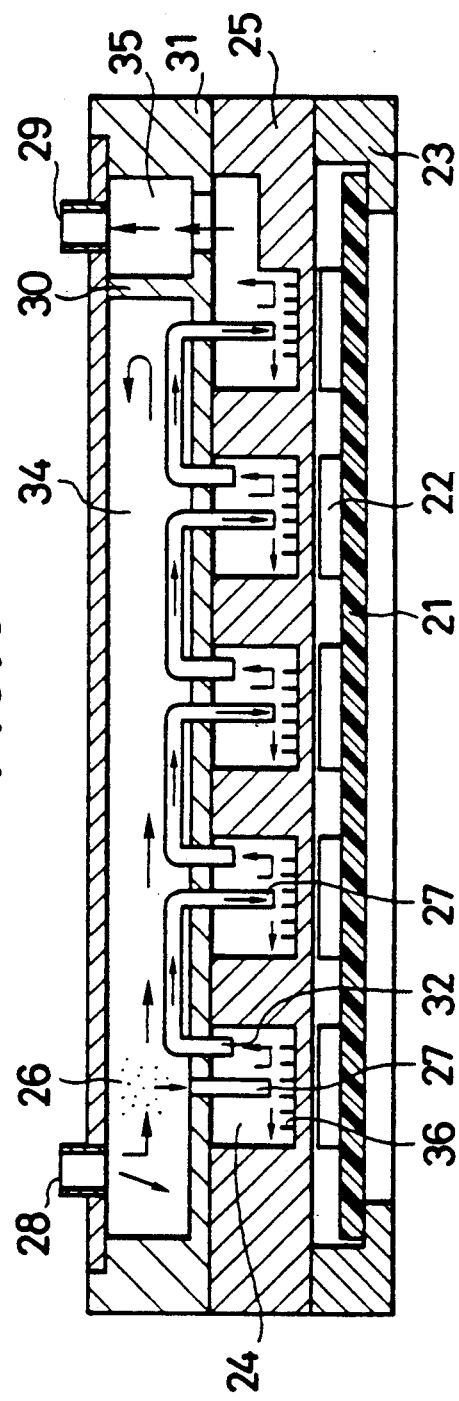

10

FLAT COOLING STRUCTURE OF INTEGRATED CIRCUIT

BACKGROUND OF THE INVENTION

The present invention relates to cooling structure of integrated circuit elements which constitute electronic units of information processing apparatus etc., and specifically relates to cooling structure of the type in which cooling fluid such as water is circulated around integrated circuit elements such that heat generated in the integrated circuit elements is transferred to the cooling fluid to thereby cool the integrated circuit elements.

Conventionally, such type of the cooling structure has a structure shown, for example, in FIG. 1 and disclosed in IBM J. RES DEVELOP Vol 26 No. 1 Jan. 1982 "A Conduction-Cooled Module for High-Performance LSI Devices" authored by S. Oktay and H. C. Kammerer. As shown in FIG. 1, an integrated circuit 101 (mounted on a lead pattern board 102 having I/0 pins 103) is placed in contact with a piston 104 biased against the integrated circuit 101 by means of a spring 105 to absorb heat from the integrated circuit 101, and the heat is transferred through a space 110 filled with helium gas to a hat 106 and an intermediate layer 107 and to a cooling plate 108 in which the heat is dissipated into cooling fluid 109.

However, in the conventional cooling structure of integrated circuit shown in FIG. 1, the piston is made contact with the integrated circuit by means of the spring to continuously apply force thereto, causing bad influence for the reliability of connection between the integrated circuit and the circuit board. In addition, in order to allow the piston to follow variation of hight and inclination produced when the integrated circuit is mounted on the circuit board, a contact portion of the piston to the integrated circuit is shaped spherical and a gap is provided between the hat and the piston. However, such structure reduces the effective heat-transfer area to thereby decrease the cooling efficiency. Moreover, since a cooling fluid passing in the cooling plate is formed for the purpose of heat transfer due to forced convection, the obtained heat-conduction coefficient is in the order of 0.1 to 0.5W/cm° C. insufficient to cool the integrated circuit of high integration density having greater power consumption.

Further, Japanese laid-open patent application publication No. 160150/1985 discloses an cooling device of the type utilizing striking stream of cooling fluid. Namely, as shown in FIG. 2, heat generated by a chip 201 mounted on a printed circuit board 202 is transferred successively to a heat-conducting substrate 203, elastic heat-conducting material layer 204 and a heat-conducting plate 205. A nozzle 206 injects cooling fluid onto the heat-conducting plate 205 to cool the same. A tip of the nozzle 206 is sealed by the heat-conducting substrate 203, a cooling header 208 and bellows 207.

However, in the prior art structure of FIG. 2, since the bellows have a relatively small thickness, the bellows may be broken to form holes due to its corrosion to thereby leak out the cooling fluid.

There is another type of the conventional cooling structure of integrated circuits comprised of a cooling plate disposed in contact with top surfaces of integrated circuits, and a cooling container which constitutes pass of cooling fluid, in which these components are divided into two parts. This conventional cooling structure is, for example, disclosed in the Japanese patent application No. 183889/1985.

The above described conventional cooling structure of integrated circuits has a drawback that flow rate of cooling fluid must be regulated in proportion to heat amount generated by semiconductor chips of integrated circuits. Further, there is another drawback that the cooling plate in contact with the integrated circuits and the cooling container which forms pass of the cooling fluid are divided into two parts, thereby increasing thermal resistance to the integrated circuits.

SUMMARY OF THE INVENTION the present invention is to, therefore, provide a cooling unit of the flat shape directly connectable to a substrate arranged with a plurality of integrated circuit chips.

Another object of the present invention is to provide a cooling unit having a plurality of cooling cells thermally connectable to respective ones of integrated circuit chips arranged on a substrate so as to efficiently cool the respective chips.

Further object of the present invention is to provide a cooling unit of the integrated circuit having perfect and permanent sealing structure of circulating coolant.

According to the present invention, an integrated circuit cooling structure may comprise, for example: a substrate; a plurality of integrated circuits arranged on the substrate; a cooling plate opposed in gap relation to the upper surfaces of the plurality of integrated circuits and formed with a plurality of cut cavities arranged in correspondence to the plurality of integrated circuits; a cooling container having a suction compartment formed with an inlet for cooling fluid and a discharge compartment formed with an outlet for cooling fluid, and being disposed on the cooling plate so as to seal the plurality of cut cavities; a plurality of nozzle pipes, each disposed through a bottom portion of the suction compartment and respectively extending vertically into each of the plurality of cut cavities; and a plurality of collecting pipes, each being disposed through the bottom portion of the suction compartment to respectively extend into each of the cut cavities except the cut cavity communicating with the discharge compartment and being directly connected in the suction compartment to another nozzle pipe communicating with an adjacent cut cavity.

BRIEF DESCRIPTION OF THE DRAWINGS

FIG. 5 is a sectional view showing a second embodiment of the inventive integrated circuit cooling structure;

FIG. 6 is a sectional view showing a third embodiment of the inventive integrated circuit cooling structure;

DESCRIPTION OF THE PREFERRED EMBODIMENTS

Hereinafter preferred embodiments of the present invention will be explained in conjunction with the attached drawings.

Figure 1:
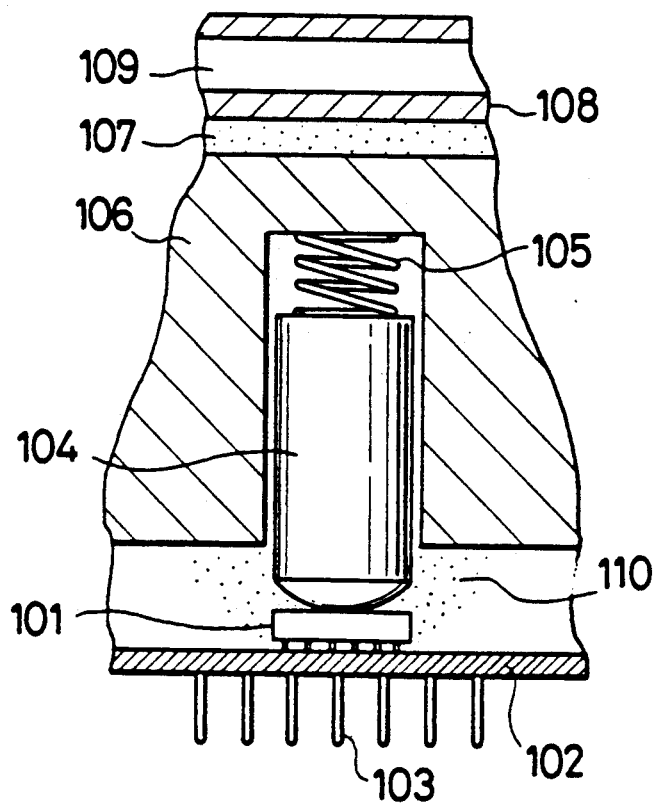
FIG. 1 is a partial sectional view of a conventional cooling structure of the integrated circuit device.
Figure 2:
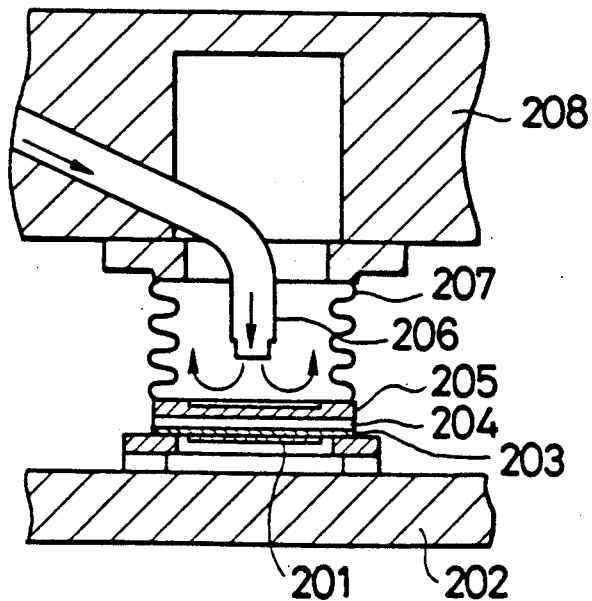
FIG. 2 is a partial sectional view of another conventional cooling structure of the integrated circuit device.
Figure 3:
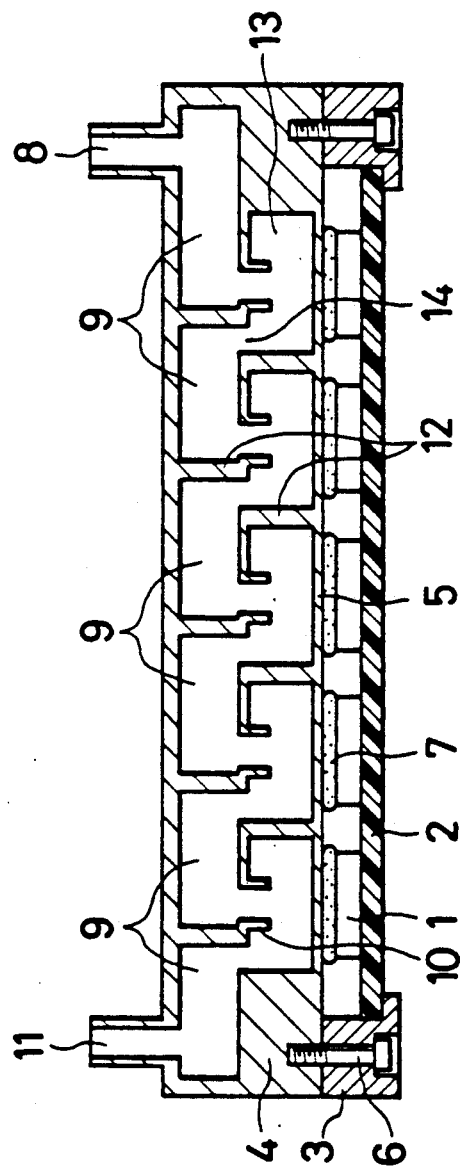
FIG. 3 is a sectional view showing a first embodiment of the inventive integrated circuit cooling structure.

FIG. 3 is a vertical sectional view showing a first embodiment according to the present invention. A circuit board 2 is provided to mount a plurality of integrated circuit chips 1. A frame 3 made of metal is attached to surround the circuit board 2. A cooling device or module 4 made of metal has therein a pass for cooling fluid, and is divided by a plurality of partitions 12 into a plurality of header compartments 9 and a plurality of cooling cavities or compartments 13. The header compartments 9 and the cooling compartments 13 are alternately connected in series to each other by means of nozzle portions 10 and communicating holes or openings 14. A plurality of row arrangements each comprised of series connection of the header compartments 9 and the cooling compartments 13 are arranged in parallel in the cooling module. The cooling module 4 has a cooling plate 5 opposed to the integrated circuits 1 and is fixed to the frame 3 by means of screws 6 so as to leave a slight gap between the cooling plate 5 and the integrated circuits 1. A heat-conducting compound 7 is filled between the gap. The heat conducting compound 7 is comprised of base material such as silicone oil mixed with heat-conducting material such as metal oxide and boron nitride.

Figure 4:
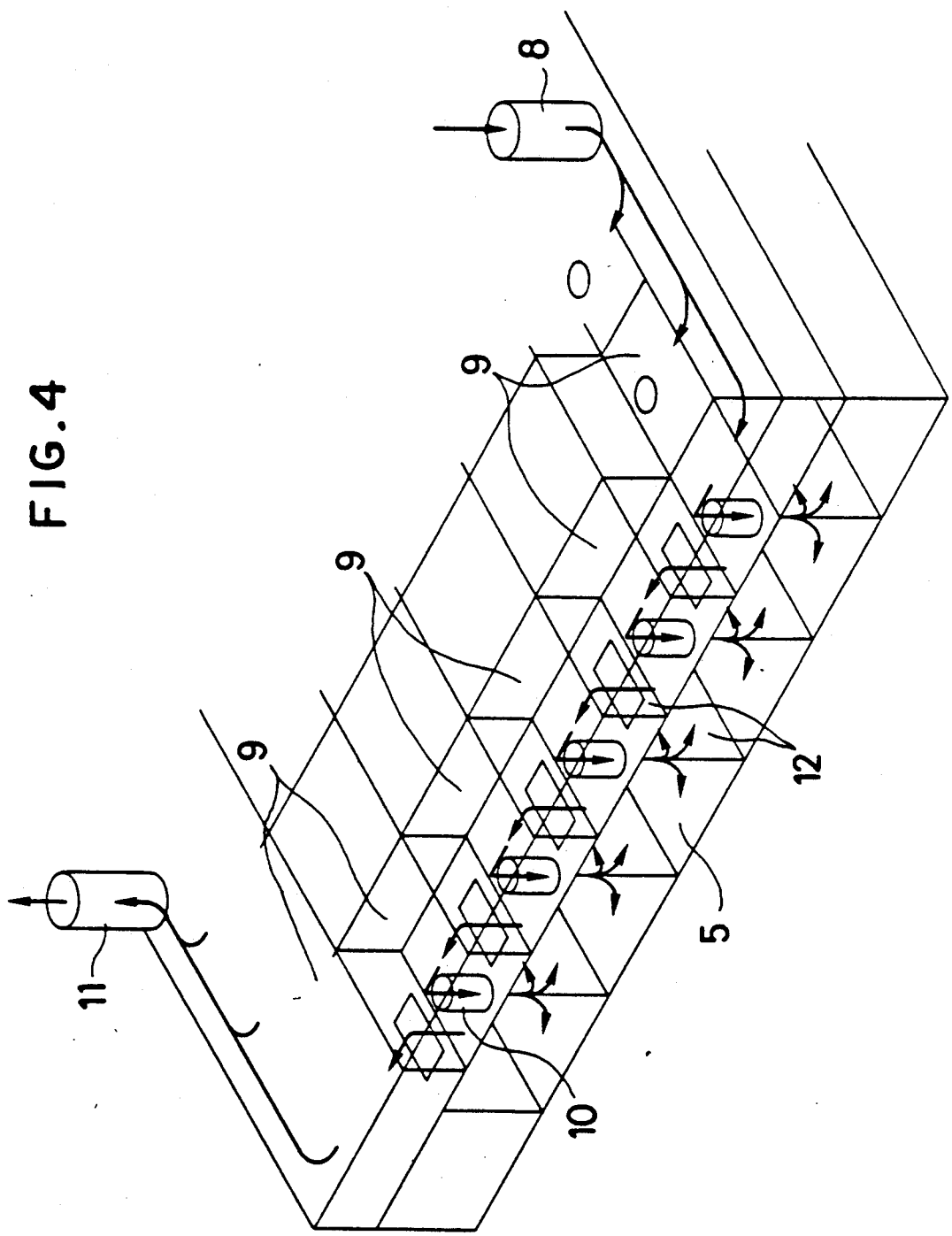
FIG. 4 is a diagrammatic perspective partial view of the FIG. 3 embodiment.

FIG. 4 shows a pass of cooling fluid in the FIG. 3 embodiment. Cooling fluid introduced into the cooling module 4 through an inlet 8 of the cooling fluid is flown into a first header compartment 9 closest to the inlet. Then, the fluid is injected therefrom into the corresponding cooling compartment 13 through a nozzle portion, and strikes against the inner face of the cooling plate 5 opposed to the integrated circuits 1. Thereafter, the cooling fluid is introduced into the next header compartment through the communicating hole 14. Accordingly, the cooling fluid passes through the series-connected header compartments 9 and the cooling compartments 13 alternately to each other. Lastly, the cooling fluid is collected and discharged outside of the cooling module 4 through an outlet 11 of the cooling fluid.

Heat generated by the integrated circuits 1 is transferred through the heat-conducting compound layer 7 to the cooling plate 5. The cooling plate 5 receives the striking cooling fluid injected from the nozzle portion 10, and therefore carries out the heat transfer to the cooling fluid. According to the experiment, with changing the injection speed from the nozzle portion in the range of 0.5 to 3.0m/s, heat-conducting rate of 1 to 3W/cm° C. is obtained. Consequently, in the cooling structure of the first embodiment, by setting sufficiently small the gap between the cooling plate 5 and the integrated circuit chips 1, it is possible to reduce the thermal resistance from the integrated circuit chip 1 to the cooling fluid below 1° C./W or less.

Further, the plastic heat-conducting compound layer 7 can follow the variation of hight dimension and inclination of the integrated circuit chip 1 caused when mounted on the circuit board 2 so as to avoid application of stress to the integrated circuit 1. By making the cooling plate 5 with highly thermo-conductive metal such as berylium copper, increase of heat resistance value can be neglected even increasing the thickness of cooling plate 5 and moreover the formation of leak hole due to the corrosion can be effectively prevented.

As described above, according to the first embodiment, since cooling fluid passing in the cooling module is arranged such that the cooling fluid injected from the nozzle strikes against the cooling plate opposed to the integrated circuits and the heat-conducting compound is filled in the gap between the integrated circuits and the cooling plate, a high heat-conductivity can be obtained and it is possible to provide a cooling module having high cooling efficiency and high reliability against corrosion.

FIG. 5 is a sectional view showing a second embodiment of the present invention. Referring to FIG. 5, a plurality of integrated circuits 22 are arranged on a substrate 21. The substrate 21 is firmly fixed at its peripheral portion to a substrate frame 23. A cooling plate 25 is opposed in gap relation to top surfaces of the integrated circuits 22, and formed with a plurality of cut cells or cavities 24 arranged correspondingly to each integrated circuit 22 and separated therefrom by a thin bottom wall.

A cooling container 31 is disposed on the cooling plate 25 to seal openings of cut cavities 24. The cooling container 31 is provided with an inlet 28 for receiving therein cooling fluid, an outlet 29 for discharging the cooling fluid, and a partition wall 30 disposed between the inlet 28 and the outlet 29 to divide the cooling container 31 into a suction compartment 34 and a discharge compartment 35. The cooling container 31 has a plurality of nozzle pipes 27, each disposed through a bottom wall of the suction compartment 34 and extending vertically toward the bottom wall of each cut cavity 24, and a plurality of collecting pipes 32, each disposed through the bottom wall of suction compartment 34 and extending into the corresponding cut cavity. Each collecting pipe 32 is arranged adjacently to the nozzle pipe 27 in the same cut cavity 24 (except the left-most cut cavity in FIG. 5), and is connected, inside the cooling container 34, directly to other nozzle pipe 27 communicating with the rightwardly adjacent cut cavity 24 in FIG. 5.

In operation, cooling fluid 26 is introduced through the inlet 28 to fill the suction compartment 34 divided by the partition wall 30. The cooling fluid 26 is injected through the left-most nozzle pipe 27 (FIG. 5) and strikes against the bottom wall of the corresponding cut cavity 24 formed in the cooling plate 25. The striking cooling fluid 26 is then collected through the corresponding collecting pipe 32 and is subsequently flown into the rightwardly adjacent nozzle pipe 27 directly connected to said collecting pipe 32. Then, lastly the cooling fluid 26 is collected through an opening formed in the bottom wall of the discharge compartment 35 to the discharge compartment 35, and thereafter discharged through the outlet 29 to outside.

Since the direct connecting portion of the adjacent nozzle pipe 27 and collecting pipe 32 is disposed inside the suction compartment 34, it is continuously immersed in the cooling fluid 26. By such arrangement, the cooling fluid 26 heated by the heat generated by the integrated circuit 22 is collected by the collecting pipe 32 and is cooled during the travel through the direct connecting portion by the cooling fluid 26 inside the suction compartment 34 prior to the next injection into the adjacent cavity 24. Accordingly, the cooling fluid 26 circulating through the pipes is always maintained at substantially constant temperature. The arrows shown in FIG. 5 indicate the flowing direction of cooling fluid.

FIG. 6 is a sectional view showing a third embodiment of the present invention. This embodiment has the same structure as that of FIG. 5 embodiment except that projections 36 are provided on the bottom wall of each cut cavity. The cooling fluid 26 injected from the nozzle pipe 27 strikes against the bottom wall of cut cavity 24 and flows around the projections 36. Thereafter, the cooling fluid 26 is collected into the corresponding collecting pipe 32 and then lastly into the discharge compartment 35 through the chain of nozzles and collecting pipes. The heat generated by the integrated circuit 22 is transferred to the cooling fluid 26 through the bottom wall of the cut cavity 24 in the cooling plate 25.

As described above, according to the second and third embodiments, by utilizing the above described cooling structure, the heat generated by the semiconductor chips is efficiently discharged outside the device by the simple structure without increasing the flow rate of cooling fluid and with reducing the thermal resistance to the semiconductor chips of integrated circuits.

Figure 7:
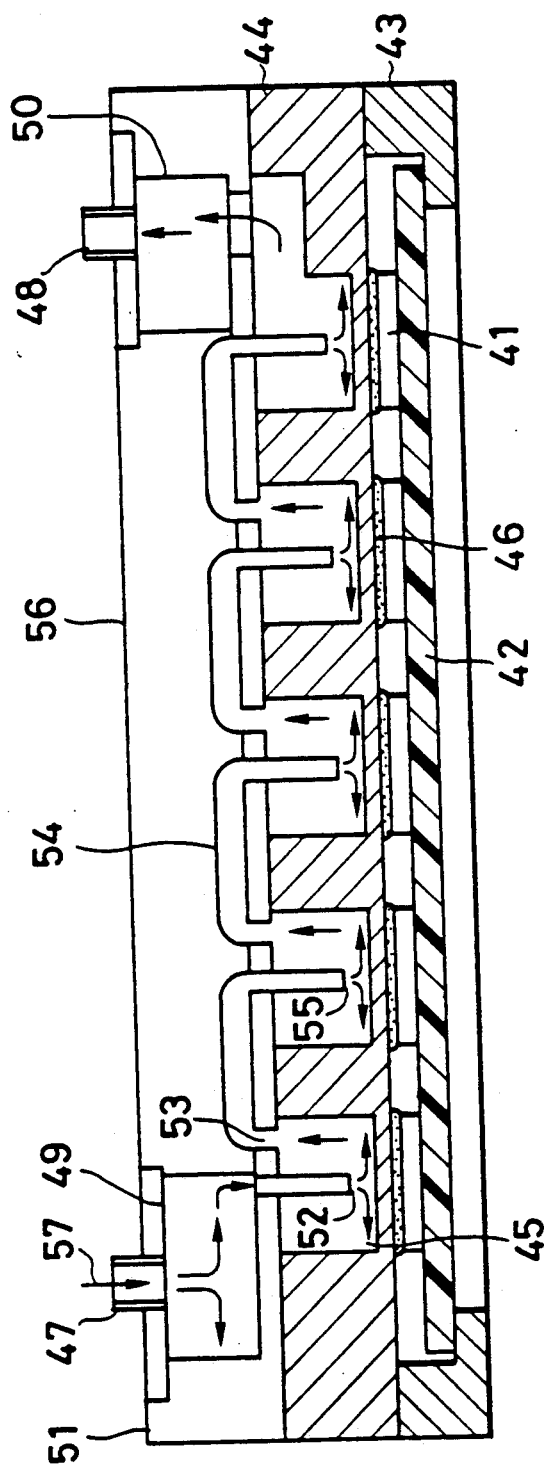
FIG. 7 is a sectional view showing a fourth embodiment of the inventive integrated circuit cooling structure.

FIG. 7 is a sectional view showing a fourth embodiment of the present invention. A plurality of integrated circuits 41 are arranged on a circuit substrate 42 in the form of matrix. A peripheral portion of the circuit substrate 42 is held by and fixed to a substrate frame 43. A cooling plate 44 is opposed in close gap relation to top faces of the integrated circuits 41 and has a plurality of cut cavities 45 in a top side thereof opposite to a bottom side thereof adjacent to the circuits. A thermally conductive compound 46 is filled in the close gap between the integrated circuits 41 and the cooling plate 44. This thermally conductive compound 46 is composed of base material such as silicone oil mixed with insulative heat-conducting material such as metal oxide and boron nitride as filler. A cooling container 56 is tightly attached to the top face of cooling plate 44. The cooling container has an inlet 47 and an outlet 48 for cooling liquid, and a header portion 51 provided with a suction header compartment 49 communicating with the inlet 47 to distribute the cooling liquid to respective rows of the cut cavities and a collecting header compartment 50 communicating with the outlet 48. Further, the header portion 51 is provided through its bottom face with a first nozzle 52 directly inserted into a first cut cavity 45 of each row, is provided through its bottom face with an opening 53 for discharging the cooling liquid from the same cut cavity 45, and is provided through its bottom face with a second nozzle 55 directly inserted into the next cut cavity 45 and communicating with the opening 53 through a cut groove 54 formed in the bottom face of the cooling container 56. These openings, second nozzles and cut grooves are successively provided through each row of cut cavities 45 as shown in FIG. 7.

When the cooling liquid 57 is flown into the inlet 47 of cooling container 56 to fill the suction header compartment 49, the cooling liquid 57 is injected from the first nozzle 52 to strike against the bottom wall of first cut cavity 45. The striking cooling liquid 57 flows sequentially through the adjacent cooling liquid discharging opening 53 and the cut groove 54 into the second nozzle 55. Finally, the cooling liquid 57 is collected in the collecting header compartment 50 and discharged from the outlet 48 to the outside.

Heat generated by the integrated circuits 41 is transferred to the cooling plate 44 through the thermally conductive compound layer 46. The cooling liquid strikes against each bottom wall of the cut cavities 45 opposed to the integrated circuits so as to effect heat transfer. According to the experiment, with changing the injection speed from the nozzle portion in the range of 0.5 to 3.0m/s, heat-conducting rate of 1 to 3W/cm° C. is obtained. Consequently, in the cooling structure of the fourth embodiment, by setting sufficiently small the gap between the cooling plate and the integrated circuit chips, it is possible to reduce the thermal resistance from the PN junctions of integrated circuit chips to the cooling fluid below 1° C./W or less. Further, the plastic heat-conducting compound layer can follow the variation of hight dimension and inclination of the integrated circuit chip caused when mounted on the circuit board so as to avoid application of stress to the integrated circuit. By making the cooling plate with highly thermo-conductive metal such as copper alloy, increase of heat resistance value can be neglected even increasing the thickness of cooling plate, and moreover the formation of leak hole due to the corrosion can be effectively prevented.

As described above, according to the fourth embodiment, a plurality of integrated circuits are arranged on the circuit substrate which is held by the substrate frame. A cooling plate is opposed in close gap relation to the top faces of the integrated circuits, and has a plurality of cut cavities in a top face thereof, corresponding to respective integrated circuits. The thermally conductive compound is filled in the close gap. The cooling container is formed with flow passes effective to strike the cooling liquid through the nozzles against the bottom walls of cut cavities opposed to the integrated circuits. By attaching the cooling plate and the cooling container tightly to each other so as to increase the thermal conductivity between the cooling plate and the cooling liquid, it is possible to provide a cooling structure having small thermal resistance and high reliability against corrosion.

Figure 8:
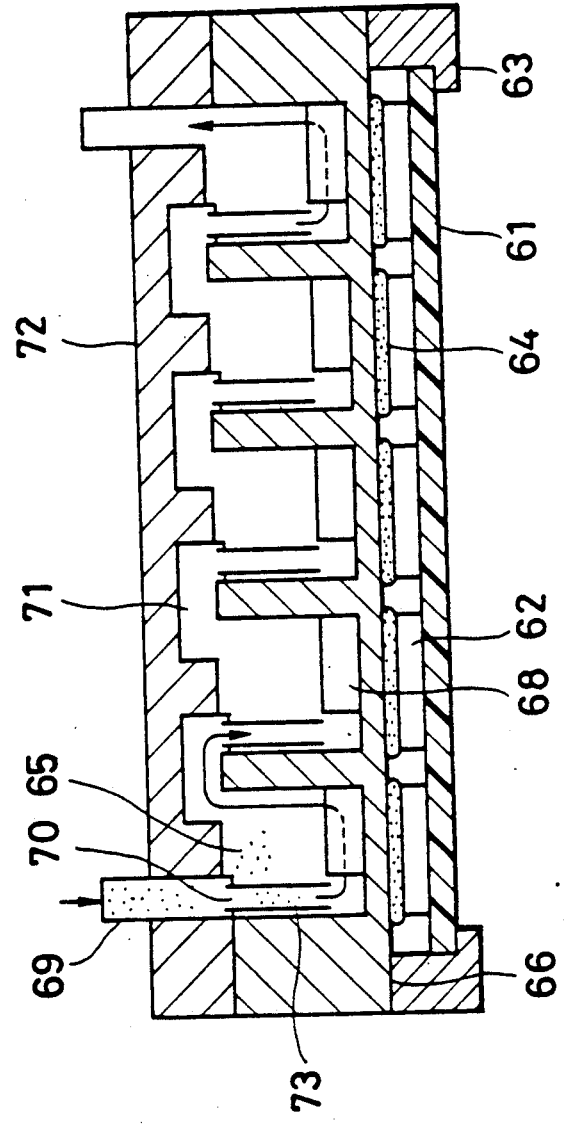
FIG. 8 is a sectional view showing a fifth embodiment of the inventive integrated circuit cooling structure.
Figure 9:
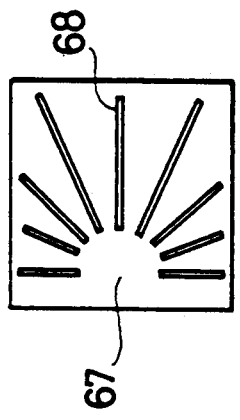
FIG. 9 is a partial plan view showing an arrangement of fins of the FIG. 8 embodiment.

FIG. 8 is a sectional view of a fifth embodiment of the present invention and FIG. 9 is a plan view of a bottom wall of cut cavity against which a stream of cooling fluid strikes. Referring to FIGS. 8 and 9, a plurality of integrated circuit elements 62 are arranged on a substrate 61 to constitute an integrated circuit. A peripheral portion of the substrate 61 is firmly fixed to a substrate frame 63. A cooling plate 66 is opposed to top faces of the integrated circuit elements 62 through intermediate heat-conducting compound 64 and formed in a top face of the cooling plate 66 with a plurality of cut cavities 65 corresponding to the respective integrated circuit elements 64. The cooling plate 66 is fixed to the substrate frame 63. Each cut cavity 65 has on its bottom wall adjacent to the corresponding integrated circuit element a plurality of fins 68 radially extending in the sector form from a center 67 deviated from the central portion of the cut cavity 65. A cooling fluid conducting device 72 is tightly fixed on the cooling plate 66 to enclose the cut cavities. The cooling fluid conducting device 72 has a plurality of suction openings each for feeding cooling fluid 69 to a corresponding cut cavity 65, and a plurality of flow passes 71 each collecting the cooling fluid 69 in the corresponding cut cavity 65 and transferring it to the suction opening communicating with the next cut cavity to thereby enable the cooling fluid 69 to flow continuously through the series of cut cavities 65. A plurality of nozzles 73 are attached to respective suction openings 70. Each nozzle 73 extends toward the center 67 of the fins 68 radially arranged on the bottom wall of each cut cavity 65 in the sector form so as to direct the fed cooling fluid 69 to the center 67.

In operation of the above structure, the cooling fluid 69 is flown through the first suction opening 70 of the cooling fluid conducting device 72 to the attached nozzle 73, and injected from the nozzle 73 to strike against the bottom wall of the corresponding cut cavity 65 to thereby cool the bottom wall. Further, the striking cooling fluid 69 flows along the fins 68 as indicated by arrow while absorbing heat of the fins 68 to be thereby lastly collected to the corresponding flow pass 71 which constitutes the discharge portion. The cooling fluid introduced into the flow pass 71 is directed to the suction opening 70 of the next cut cavity 65, and is then injected from the next nozzle 73. The cooling fluid 69 flows successively through the cut cavities, and is lastly discharged outside of the device.

As described above, according to the fifth embodiment, in view of the features that the heat generated by the integrated circuit elements are transferred to the radially arranged fins formed on the cooling plate so as to broaden the contact area to the cooling fluid and that the continuous flow of cooling fluid is improved, the thermal resistance between the integrated circuit elements and the cooling fluid can be reduced to low value, and the flow rate of cooling fluid can be reduced to efficiently discharge the heat to outside of the device.

Figure 10:
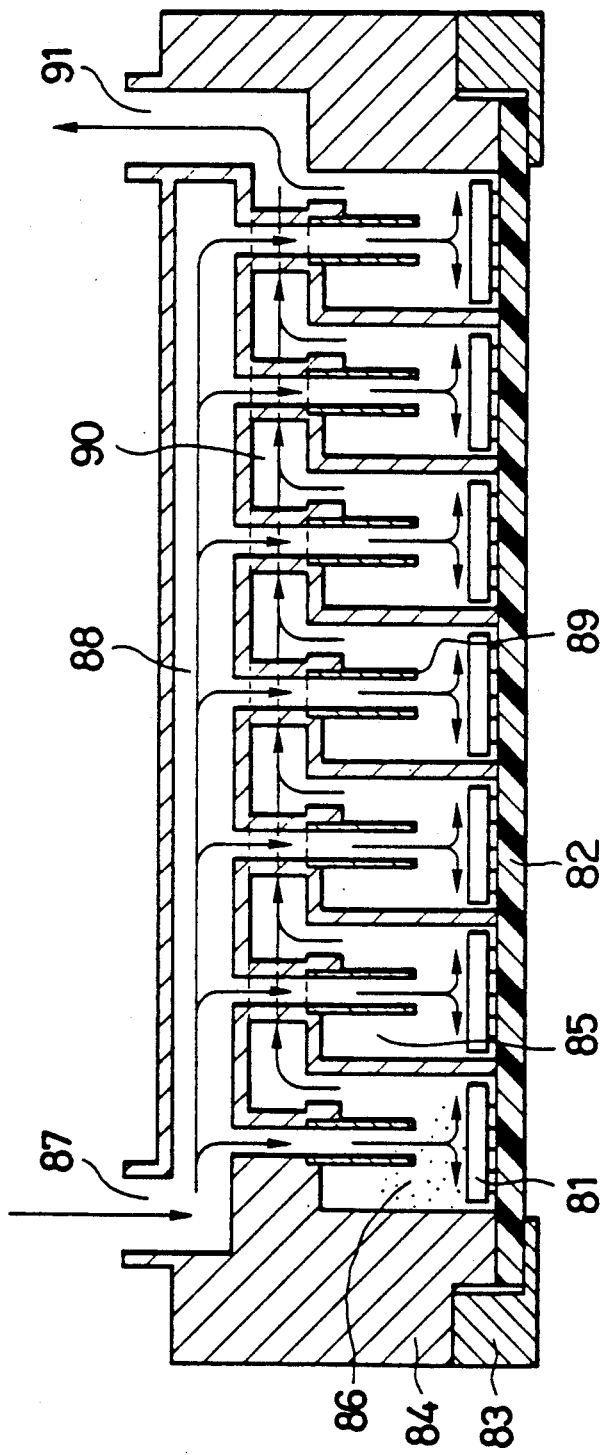
FIG. 10 is a sectional view showing a sixth embodiment of the inventive integrated circuit cooling structure.

FIG. 10 is a sectional view showing a sixth embodiment of the present invention. A plurality of integrated circuits 81 are arranged on a circuit substrate 82 in the form of matrix. A peripheral portion of the circuit substrate 82 is held by and fixed to a substrate frame 83. A cooling module or container 84 has a plurality of cut cavities 85 in a bottom side thereof, which enclose individual circuits 81 to separate them from each other. The cooling container 84 has an inlet 87 for introducing inert liquid 86 into the cooling container 84, a suction header compartment 88 for distributing and feeding the introduced inert liquid 86 into the respective cut cavities 85, a collecting header compartment 90 for collecting the inert liquid 86 discharged from the respective cut cavities 85, and an outlet 91 for discharging the collected inert liquid 86 to the outside. A plurality of nozzles 89 are provided in the respective cut cavities 85 for injecting the inert liquid fed from the suction header compartment 88 onto top faces of the respective integrated circuits 81.

When the inert liquid 86 is flown into the inlet 87 of the cooling container 84 to fill the suction header compartment 88, the inert liquid 86 is injected from the nozzles 89 to strike against the top faces of respective integrated circuits 81. The striking inert liquid 86 directly absorbs the heat, then flows into the collecting header compartment 90, and is finally discharged outside from the outlet 91.

The inert liquid 86 which directly absorbs heat from the integrated circuits 81 and discharged it to the outside can be composed of liquid having electrically insulating characteristic and not deteriorating metal, plastic and rubber etc.

As described above, according to the sixth embodiment, by directly injecting and striking the inert liquid onto the plurality of integrated circuits mounted on the circuit substrate by means of the nozzles, the thermal resistance from the heat generating portions of integrated circuits to the cooling fluid can be reduced by reducing the number of heat-transfer stages to thereby increase the integration density of the integrated circuit chip and to sufficiently improve the cooling performance even when the power consumption is increased. Further, by constituting the corrosion-resistant cooling container, it is possible to obtain highly reliable cooling structure which is not affected by leakage of the cooling fluid.

What is claimed is:

1. An integrated circuit cooling structure, comprising: a substrate; a plurality of integrated circuits arranged on said substrate; a cooling plate opposed in gap relation to the upper surfaces of said plurality of integrated circuits and formed with a plurality of cut cavities arranged in correspondence to said plurality of integrated circuits; a cooling container having a suction compartment formed with an inlet for cooling fluid and a discharge compartment formed with an outlet for cooling fluid, and being disposed on said cooling plate so as to seal said plurality of cut cavities; a plurality of nozzle pipes, each disposed through a bottom portion of said suction compartment and respectively extending vertically into each of said plurality of cut cavities; and a plurality of collecting pipes, each being disposed through said bottom portion of the suction compartment to respectively extend into each of the cut cavities except the cut cavity communicating with the discharge compartment and being directly connected in said suction compartment to another nozzle pipe communicating with an adjacent cut cavity.

2. An integrated circuit cooling structure, as claimed in claim 1, wherein each of said plurality of cut cavities has projections on a bottom portion thereof.

3. An integrated circuit cooling structure, comprising: a circuit substrate; a plurality of integrated circuits arranged on said circuit substrate; a substrate frame for holding said circuit substrate; a cooling plate opposed in close gap relation to the top faces of said plurality of integrated circuits, and having a plurality of cut cavities in a top face of said cooling plate corresponding to each of the plurality of integrated circuits; a thermally conductive compound filled in a close gap between a bottom face of said cooling plate and said top faces of said plurality of integrated circuits; and a cooling container tightly fixed to said cooling plate to close said plurality of cut cavities, said cooling container having an inlet and an outlet for cooling liquid, a header portion having a suction compartment communicating with said inlet and a collecting compartment communicating with said outlet for distributing cooling liquid to rows of each of the plurality of cut cavities, and a plurality of nozzles positioned through a bottom of said header portion and directly introduced into each of the plurality of cut cavities.

4. An integrated circuit cooling structure as claimed in claim 3, wherein said cooling container has a first nozzle for injecting cooling liquid into a first cut cavity of each row, corresponding to an integrated circuit disposed closest to said inlet, an opening communicating with said first cut cavity for discharging therefrom cooling liquid, a second nozzle directly inserted into a next cut cavity, and a cut groove directly connecting between said opening and said second nozzle.

5. An integrated circuit cooling structure, comprising: a substrate; an integrated circuit including a plurality of integrated circuit elements arranged on said substrate; a substrate frame for holding said substrate; a cooling plate having a bottom face opposed in close gap relation to said plurality of integrated circuit elements, and a top face formed therein with a plurality of cut cavities corresponding to each of said plurality of integrated circuit elements, each of said plurality of cut cavities having a bottom wall and a plurality of fins formed on said bottom wall and extending radially from a center which is deviated from the central portion of said bottom wall; and a cooling fluid conducting device arranged to come into contact with said cooling plate to enclose said plurality of cut cavities, and having a plurality of suction openings, each for feeding cooling fluid to each of said plurality of cut cavities, a plurality of nozzles each being connected to the corresponding suction opening and extending into the corresponding cut cavity for directing said cooling fluid to the center of the radial arrangement of said plurality of fins, and a plurality of flow passes, each for discharging said cooling fluid in one cut cavity to a suction opening of an adjacent another cut cavity.

6. An integrated circuit cooling structure, comprising: a circuit substrate; a plurality of integrated circuits arranged on said circuit substrate; a substrate frame for holding said circuit substrate; and a cooling module having in its bottom side a plurality of cut cavities and being tightly fixed to said circuit substrate so as to enclose each of said plurality of integrated circuits in the corresponding cut cavity, said cooling module having an inlet to receive inert liquid, a suction header compartment communicating with said inlet, a plurality of nozzles communicating between said suction header compartment and each of said plurality of cut cavities for injecting inert liquid into each of said plurality of cut cavities to thereby enable said inert liquid to strike against each of said plurality of integrated circuits, a collecting header compartment communicating with each of said plurality of cut cavities for collecting inert liquid injected thereinto, and an outlet to discharge said inert liquid collected into said collecting header compartment to the outside.

* * * * *